(12) United States Patent
Chuang

(10) Patent No.: US 11,855,032 B2
(45) Date of Patent: Dec. 26, 2023

(54) SEMICONDUCTOR STRUCTURE AND MANUFACTURING METHOD THEREOF

(71) Applicant: ChangXin Memory Technologies, Inc., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 17/429,592

(22) PCT Filed: Jun. 15, 2020

(86) PCT No.: PCT/CN2020/096085
§ 371 (c)(1),
(2) Date: Aug. 9, 2021

(87) PCT Pub. No.: WO2021/103489
PCT Pub. Date: Jun. 3, 2021

(65) Prior Publication Data
US 2022/0115352 A1   Apr. 14, 2022

(30) Foreign Application Priority Data
Nov. 29, 2019   (CN) .......................... 201911205447.1

(51) Int. Cl.
*H01L 23/00* (2006.01)
*H01L 21/306* (2006.01)

(52) U.S. Cl.
CPC ........ *H01L 24/32* (2013.01); *H01L 21/30604* (2013.01); *H01L 24/05* (2013.01);
(Continued)

(58) Field of Classification Search
CPC ... H01L 24/32; H01L 21/30604; H01L 24/05; H01L 24/13; H01L 2224/11;
(Continued)

(56) References Cited

U.S. PATENT DOCUMENTS

2008/0251281 A1* 10/2008 Buchwalter .......... H05K 3/3436
                                                   257/E23.021
2015/0061118 A1*  3/2015 Chen ................... H01L 23/5386
                                                        228/256
2019/0131272 A1   5/2019 Wirz et al.

FOREIGN PATENT DOCUMENTS

CN         102915987 A      2/2013
CN         209045542 U      6/2019
(Continued)

OTHER PUBLICATIONS

PCT/CN2020/096085 International Search Report dated Sep. 17, 2020, with English translation.

*Primary Examiner* — Douglas W Owens
(74) *Attorney, Agent, or Firm* — Alston & Bird LLP

(57) ABSTRACT

The disclosed semiconductor structure includes a semiconductor substrate, a metal pad, a bump, a first solder layer, a barrier layer, and a second solder layer. The metal pad is disposed on the semiconductor substrate; the bump is arranged on the metal pad; the barrier layer is configured on the side of the bump away from the metal pad. The barrier layer includes a first surface and a second surface. The first solder layer is arranged between the bump and the first surface of the barrier layer. The second solder layer is configured on the second surface of the barrier layer. Since the first solder layer and the second solder layer are formed by reflowed and melt solder at a high temperature and can be stretched, the height of the second solder can be adjusted automatically, which reduces the non-wetting problem caused by the package substrate deformation after reflow.

17 Claims, 16 Drawing Sheets

(52) U.S. Cl.
CPC .......... *H01L 24/13* (2013.01); *H01L 2224/11* (2013.01); *H01L 2224/13006* (2013.01); *H01L 2224/13026* (2013.01); *H01L 2224/1354* (2013.01); *H01L 2224/81815* (2013.01)

(58) Field of Classification Search
CPC . H01L 2224/13006; H01L 2224/13026; H01L 2224/1354; H01L 2224/81815; H01L 24/03; H01L 24/81; H01L 2224/0401; H01L 2224/05082; H01L 2224/05558; H01L 2224/05568; H01L 2224/05572; H01L 2224/10145; H01L 2224/13018; H01L 24/11; H01L 2224/1308; H01L 2224/16227; H01L 2224/16237; H01L 2924/3841; H01L 23/488; H01L 24/04
See application file for complete search history.

(56) References Cited

FOREIGN PATENT DOCUMENTS

| | | | |
|---|---|---|---|
| CN | 209119091 U | 7/2019 | |
| WO | WO 1997/041594 A1 | 11/1997 | |
| WO | WO-9741594 A1 * | 11/1997 | ............. H01L 24/10 |
| WO | WO-2014033977 A1 * | 3/2014 | ........... H01L 23/481 |
| WO | WO 2019/089171 A1 | 5/2019 | |
| WO | WO 2021/103489 A1 | 6/2021 | |

* cited by examiner

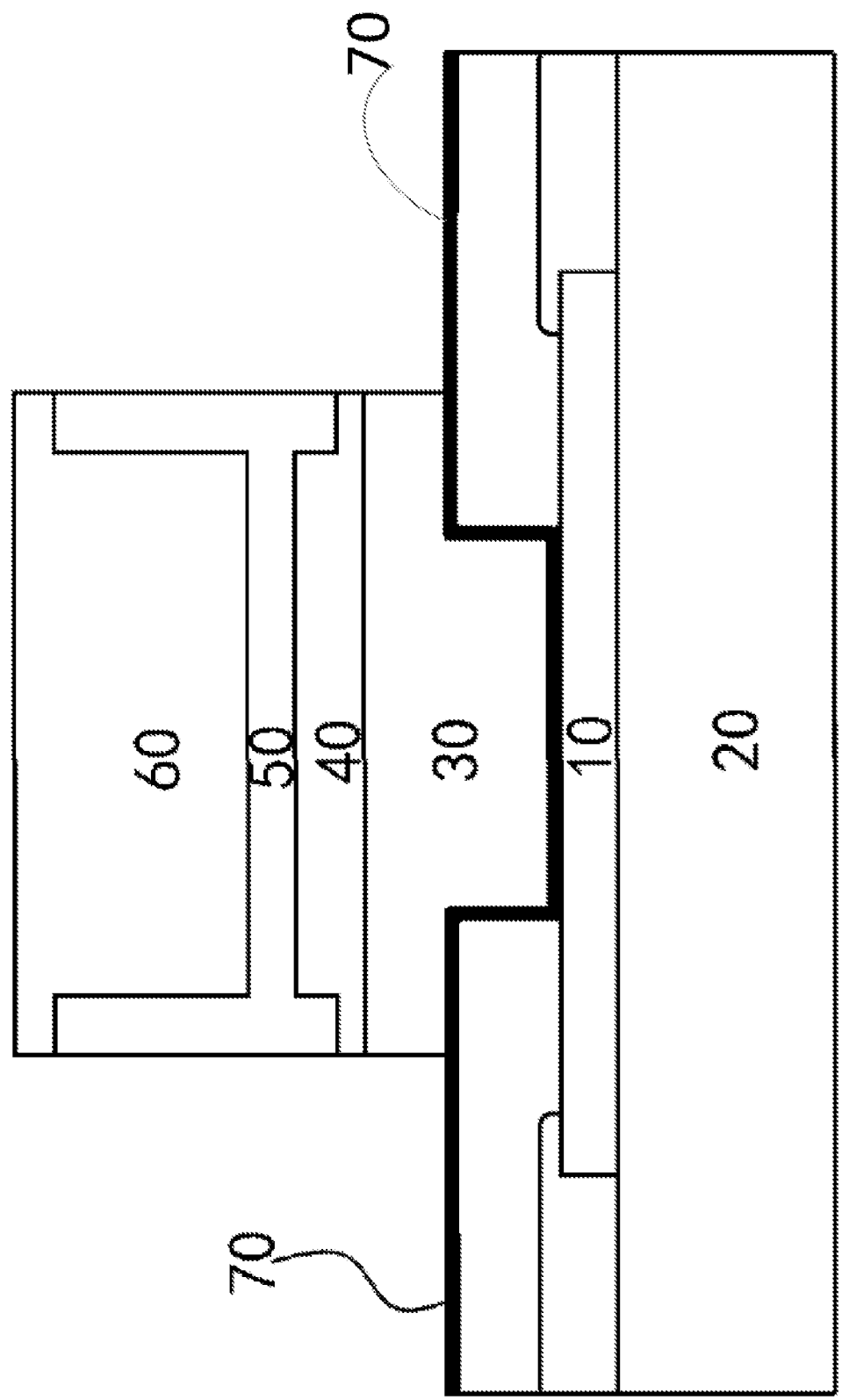

SEMICONDUCTOR STRUCTURE AND MANUFACTURING METHOD THEREOF

CROSS REFERENCES TO RELATED APPLICATIONS

This application is a national phase entry of International Application No. PCT/CN2020/096085 filed on Jun. 15, 2020, which claims the benefit of priority to CN Patent Application CN201911205447, filed on Nov. 29, 2019, both entitled "Semiconductor Structure and Manufacturing Method Thereof", the contents of which are incorporated herein by reference in its entirety.

TECHNICAL FIELD

The present disclosure relates to the field of semiconductor technology, and in particular to a semiconductor structure and a manufacturing method thereof.

BACKGROUND

As integration levels, functions, and performance of integrated circuits become ever higher, plus the emergence of new types of integrated circuits, packaging technology has been playing an increasingly important role in the value of the entire integrated circuit products and electronic systems. Bump interconnect technology, with its good electrical performance and resistance to electromigration, has become a key technology for the next generation chip interconnection at narrow-pitch.

In the current arts, during the flip-chip soldering process, the packaging substrates tend to be warped when they are heated, the flatness difference between a chip and its substrate will occur, solder can creep if the amount of solder is not enough to weld, causing the problem of surface non-wetting, or solder bridging between blocks can occur if there is too much solder.

Based on the above, it is necessary to provide a semiconductor structure and a manufacturing method to overcome the above-mentioned drawbacks in the prior art.

SUMMARY

According to the first embodiment of the present disclosure, a semiconductor structure, comprising: a semiconductor substrate; a metal pad disposed on the semiconductor substrate; a bump disposed on the metal pad; a barrier layer disposed on a side of the bump away from the metal pad, wherein the barrier layer includes a first surface and a second surface; a first solder layer disposed between the bump and the first surface of the barrier layer; and a second solder layer disposed on the second surface of the barrier layer.

In some examples, the barrier layer comprises a first groove, wherein a notch of the first groove faces a direction away from the first solder layer, and the second solder layer is disposed in the first groove, wherein a part of the second solder layer protrudes from the first groove; and the barrier layer further comprises a second groove, wherein the first solder layer is disposed in the second groove.

In some examples, a cross section of the barrier layer has an H-shape.

In some examples, the barrier layer and the bump are separated by the first solder layer.

In some examples, the second solder layer is provided in the first groove, and/or the second solder layer is provided in the second groove.

In some examples, the first groove and the second groove are both semi-closed grooves.

In some examples, a distance between a bottom surface of the second groove and a top surface of the bump is in a range of 5 um-50 um.

In some examples, a depth of the first groove is greater than a depth of the second groove.

In some examples, the bump comprises a copper pillar, wherein the semiconductor structure further comprises: an under-bump metal layer, wherein at least a part of the under-bump metal layer is sandwiched between the metal pad and the bump.

In some examples, the semiconductor structure further comprises: a first protection layer disposed on the semiconductor substrate, wherein the first protection layer comprises a first opening, and wherein the first opening exposes a part of the metal pad.

In some examples, the semiconductor structure further comprises: a second protective layer disposed on the first protective layer, wherein the second protective layer comprises a second opening, wherein a width of the second opening is smaller than or equal to a width of the first opening; and wherein at least part of the under-bump metal layer is disposed in the second opening and covers a bottom surface and sidewall surfaces of the second opening.

According to another embodiment of the present disclosure, a method of manufacturing a semiconductor structure, comprising: providing a semiconductor substrate; forming a metal pad on the semiconductor substrate; forming a bump on the metal pads; forming a first solder layer on a side of the bump away from the metal pad; forming a barrier layer on a side of the first solder layer away from the bump; and forming a second solder layer on a side of the barrier layer away from the first solder layer.

In some examples, the barrier layer comprises a first groove and a second groove separated from each other, wherein a notch of the first groove faces away from the first solder layer, wherein the first solder layer is arranged in the second groove, the second solder layer is formed in the first groove, and wherein a part of the second solder layer protrudes from the notch of the first groove.

In some examples, before forming the bump, the manufacturing method further comprises: forming an under-bump metal layer on the metal pad, wherein at least part of the under-bump metal layer is sandwiched between the metal pad and the bump.

In some examples, before forming the bump, the manufacturing method further comprises: forming a first protective layer on the semiconductor substrate, wherein the first protection layer has a first opening, and wherein the first opening exposes a part of the metal pad.

In some examples, after forming the first protective layer, the manufacturing method further comprises: forming a second protective layer on an upper surface of the first protective layer and an upper surface of the metal pad; wherein after forming the second protection layer, forming the under-bump metal layer on the metal pad and the second protection laver; wherein the second protection layer comprises a second opening, wherein a width of the second opening is smaller than or equal to a width of the first opening; and wherein at least part of the under-bump metal layer is disposed in the second opening and covers a bottom surface and sidewall surfaces of the second opening.

In some examples, before forming the bump, further comprising: forming a first photoresist layer on the semiconductor outside an area of the bump and the first solder layer; and removing the first photoresist layer after forming the bump and the first solder layer.

In some examples, before forming the barrier layer, further comprising: forming a first mask layer on the semiconductor substrate covering the first solder layer; patterning the first mask layer by a photolithography process to expose a part of the first solder layer; etching the part of the first solder layer by a chemical acid etching process, and removing the first mask layer; forming a second mask layer; patterning the second mask layer by a photolithography process to expose the first mask layer, wherein the barrier layer is formed on the first solder layer and the second mask layer, wherein the first solder layer is configured between the barrier layer and the bump.

In some examples, after forming the barrier layer, further comprising, forming a second photoresist layer on the barrier layer aligned above to the first solder layer; patterning the barrier layer not covered by the second photoresist layer; removing the second photoresist layer; filling solder in the first groove to form the second solder layer; and removing the second mask layer.

In some examples, after forming the barrier layer, further comprising: forming a third photoresist layer on the barrier layer in areas not aligned above to the first solder layer; filling solder in the first groove to form the second solder layer; removing the third photoresist layer; etching the barrier layer at a location not covered by solder; and removing the second mask layer.

The semiconductor structure of the present invention includes a semiconductor substrate, a metal pad, a bump, a first solder layer, a barrier layer, and a second solder layer. The metal pad is disposed on the upper surface of the semiconductor substrate, and then the bump, the first solder layer, a barrier layer, and a second solder layer are sequentially disposed upwards. Since the second solder layer and the first solder layer are respectively arranged on two sides of the barrier layer, the problem of non-wetting caused by insufficient solder amount during the flip-chip soldering process can be mitigated.

BRIEF DESCRIPTION OF THE DRAWINGS

By considering the following detailed description of the preferred embodiments of the present disclosure in conjunction with the accompanying drawings, various objectives, features, and advantages of the present disclosure will become more apparent. The drawings are merely exemplary illustrations of the present disclosure and are not necessarily drawn to scale. In the drawings, the same reference numerals always indicate the same or similar parts. The figures are:

FIG. 16 is a schematic diagram of a structure after etching a second mask layer by a method for preparing a semiconductor structure according to an exemplary embodiment.

Figure 1:
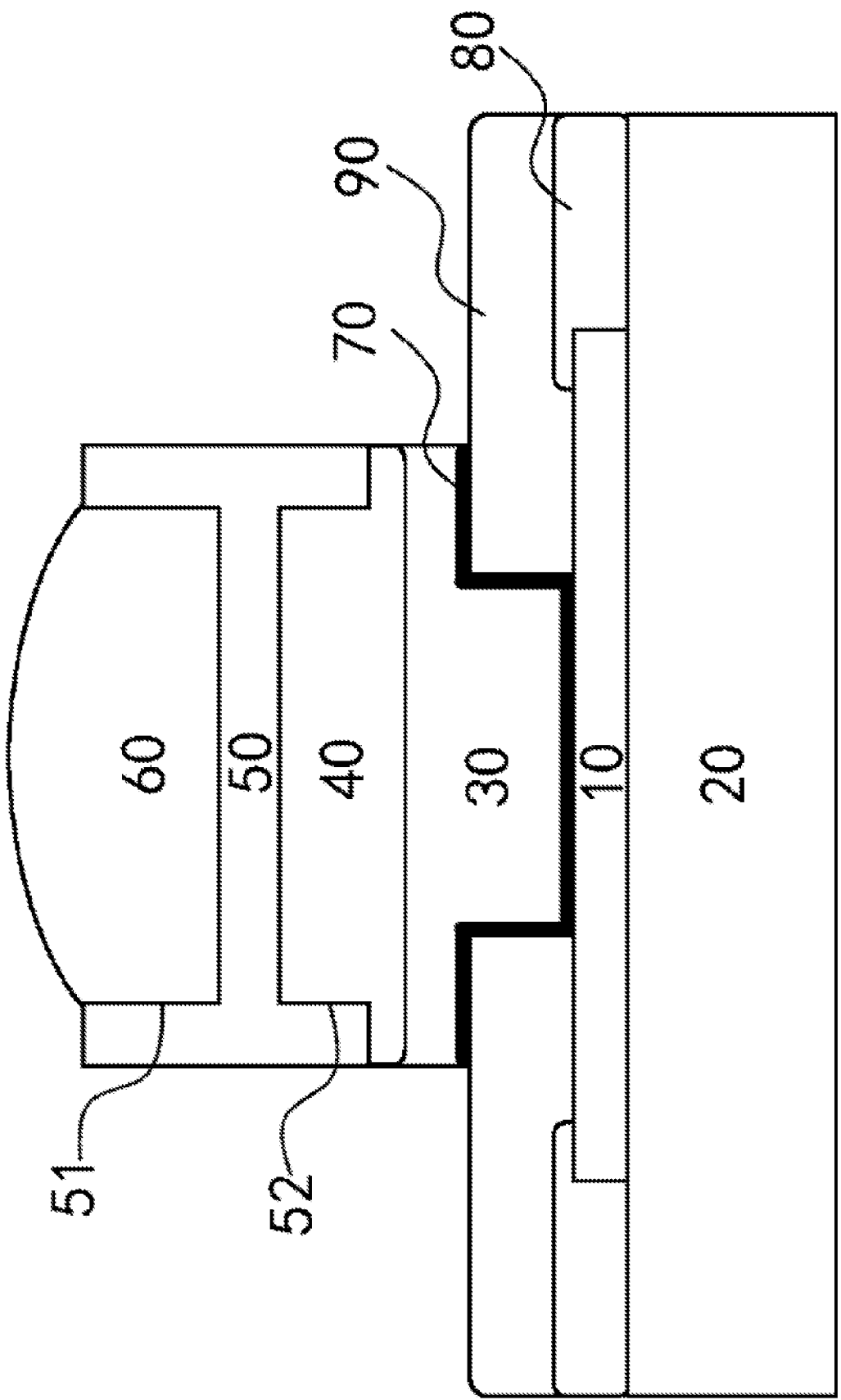
FIG. 1 is a schematic diagram showing a semiconductor structure according to an exemplary embodiment.

The reference numerals are explained as follows:
1, Package substrate; 10, metal pad; 11, first photoresist layer; 12, first mask layer; 13, second mask layer; 14, second photoresist layer; 20, semiconductor substrate; 30, Bump; 40, first solder layer; 41, removal space; 50, barrier layer; 51, first enclosing groove; 52, second enclosing groove; 60, second solder layer; 70, metal layer under bump; 80, the first protective layer; 90, the second protective layer.

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different variations and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Typical embodiments embodying the features and advantages of the present disclosure will be described in detail in the following description. It should be understood that the present disclosure can have various changes in different embodiments, which do not depart from the scope of the present disclosure, and the description and drawings therein are essentially for illustrative purposes, rather than limiting the present disclosure.

In the following description of the different exemplary embodiments of the present disclosure, reference is made to the accompanying drawings, which form a part of the present disclosure, and therein are shown by way of different exemplary structures, systems, and steps that can implement various aspects of the present disclosure. It should be understood that other specific solutions of components, structures, exemplary devices, systems, and steps can be used, and structural and functional modifications can be made without departing from the scope of the present disclosure. Moreover, although the terms "above", "between", "within", etc. may be used in this specification to describe different exemplary features and elements of the present disclosure, these terms are used herein for convenience only, such as an arrow pointing to a direction in a drawing. Nothing in this specification should be understood as requiring a specific three-dimensional direction of the structure to fill within the scope of the present disclosure.

An embodiment of the present invention provides a semiconductor structure. Please refer to FIG. 1 and FIG. 2. The semiconductor structure includes: a semiconductor substrate 20; a metal pad 10 disposed on the semiconductor substrate 20; a bump 30 disposed on the metal pad 10; the barrier layer 50 is disposed on the side of the bump 30 away from the metal pad 10, the barrier layer 50 includes a first surface facing down and a second surface facing up; the first solder layer 40 is disposed between the bump 30 and the first surface of the barrier layer 50; and the second solder layer 60 is disposed on the second surface of the barrier layer 50.

The semiconductor structure of the embodiment of the present invention is composed of a semiconductor substrate 20, a metal pad 10, a bump 30, a first solder layer 40, a barrier layer 50, and a second solder layer 60. The metal pad 10 is disposed on the semiconductor substrate 20. The surface is then provided with a bump 30, a first solder layer 40, a barrier layer 50, and a second solder layer 60 in an upwards order. Since the second solder layer 60 and the first solder layer 40 are respectively disposed on two sides of the barrier layer 50, the problem of surface non-wetting caused by insufficient solder amount during the flip-chip soldering process can be mitigated.

In one embodiment, the barrier layer 50 has a first enclosing groove 51, the notch of the first enclosing groove 51 faces away from the first solder layer 40, the second solder layer 60 is disposed in the first enclosing groove 51, and a part of the second solder layer 60 protrudes from the notch of the first enclosing groove 51; and/or the barrier layer 50 has a second enclosing groove 52, and the first solder layer 40 is disposed in the second enclosing groove 52, the first surface of the barrier layer is in contact of the bottom surface of the second enclosing groove 52, and the second surface of the barrier layer is in contact of the bottom of the first enclosing groove 51. From the arrangement of the first enclosing groove 51 and/or the second enclosing groove 52, during the flip-chip reflow process, the barrier layer 50 can block the flow of the solder and act as a drain.

Figure 2:
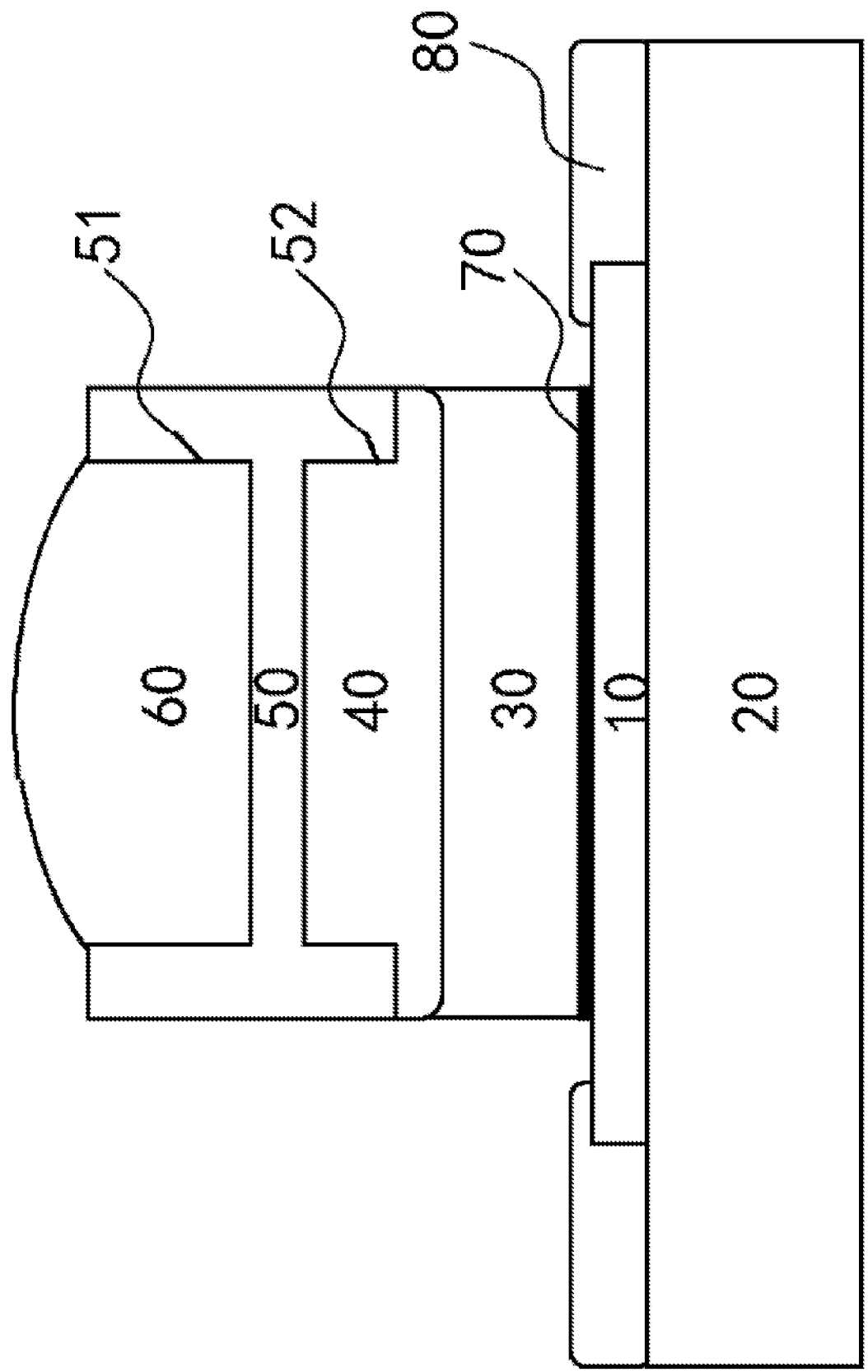
FIG. 2 is a schematic structural diagram showing a semiconductor structure according to another exemplary embodiment.

In one embodiment, referring to FIG. 1 and FIG. 2, the semiconductor structure includes: a semiconductor substrate 20; a metal pad 10 arranged on the semiconductor substrate 20; a bump 30 arranged on the metal pad 10; a first solder layer 40, arranged on the side of the bump 30 away from the metal pad 10; the barrier layer 50 is arranged on the side of the first solder layer 40 away from the bump 30, the barrier layer 50 has a first enclosing groove 51 and a second enclosing groove 52, the notch of the first enclosing groove 51 faces away from the first solder layer 40, the first solder layer 40 is arranged in the second enclosing groove 52; the second solder layer 60 is arranged in the first enclosing groove 51, a part of the second solder layer 60 protrudes from the notches of the first enclosing groove 51.

The semiconductor structure of the embodiment of the present invention is composed of a semiconductor substrate 20, a metal pad 10, a bump 30, a first solder layer 40, a barrier layer 50, and a second solder layer 60. The metal pad 10 is disposed on the semiconductor substrate 20. The surface of the metal pad 10 is then provided with a bump 30, a first solder layer 40, a barrier layer 50, and a second solder layer 60 in an upward order. Since the second solder layer 60 and the first solder layer 40 are tucked in the barrier layer 50, the non-wetting problem caused by insufficient solder and solder bridging caused by excessive solder volume are both improved during the flip-chip soldering process.

Figure 3:
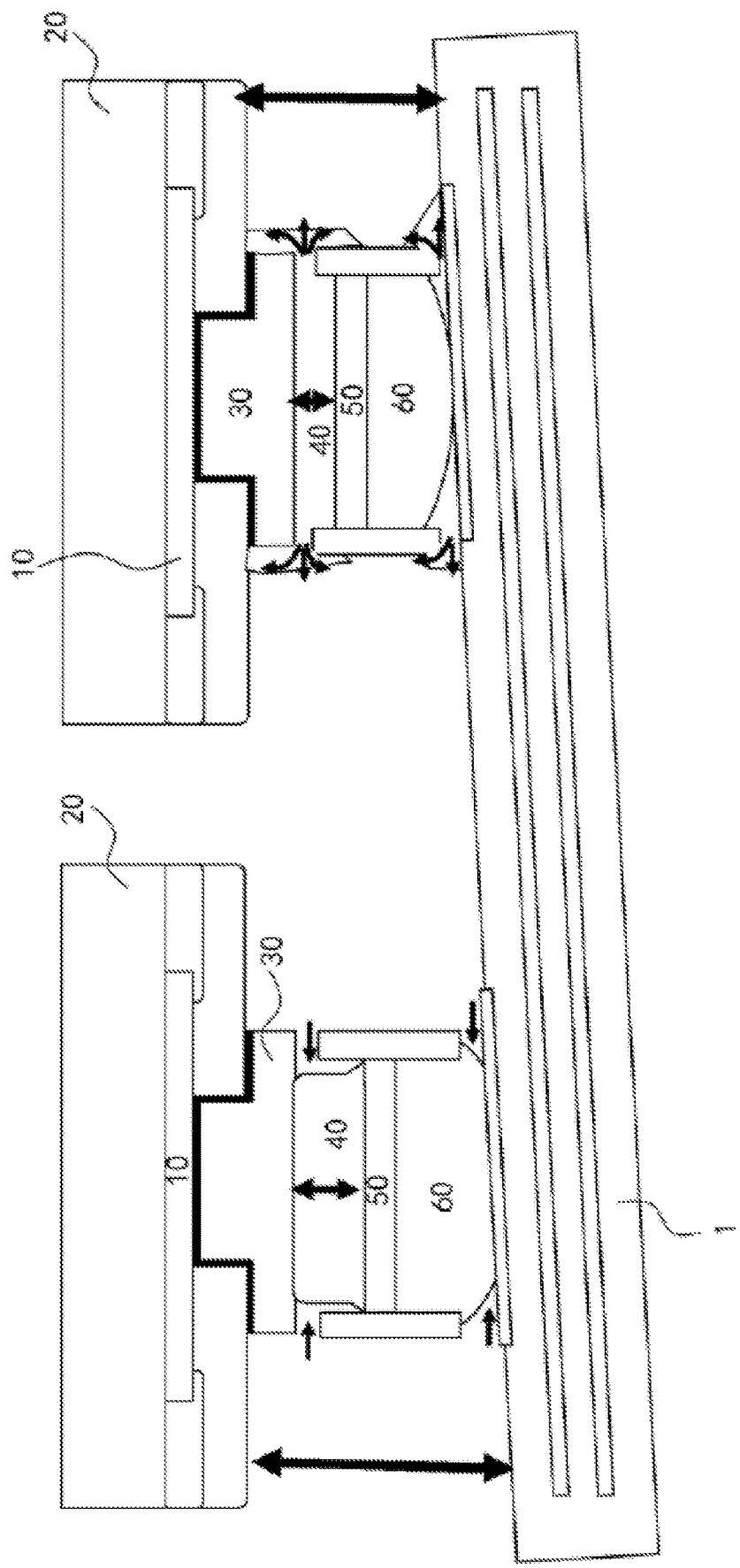
FIG. 3 is a schematic diagram showing an assembly structure of a semiconductor structure and a packaging substrate according to an exemplary embodiment.

In one embodiment, as shown in FIG. 3, the semiconductor structure is a stretchable metal. During the flip-chip soldering process, the package substrate 1 is heated and warped, and the first solder layer 40 has gone through reflow at a high temperature, melted and stretchable. Therefore, the height adjustment is automatically performed, which can reduce the non-wetting problem caused by the deformation of the package substrate 1 after reflow.

In one embodiment, the first enclosing groove 51 and the second enclosing groove 52 each of the barrier layer 50 have only one open side, that is, the first enclosing groove 51 and the second enclosing groove 52 are both semi-closed grooves. Among them, the barrier layer 50 can block the flow of the solder and play a role of drainage, so that the second solder layer 60 does not diffuse in large amounts, which avoids the problem of solder bridging, meeting the goal of improving the yield.

In one embodiment, the distance between the bottom surface of the second enclosing groove 52 and the bump 30 top is 5 um-50 um, that is, the thickness of the first solder layer 40 between the bottom surface of the second enclosing groove 52 and the bump 30 top is in the range of 5 um-50 um. Further, the distance between the bottom surface of the second enclosing groove 52 and the bump 30 top is 15 um-35 um. Optionally, the distance between the bottom surface of the second enclosing groove 52 and the bump 30 top is about 5 um, 10 um, 13 um, 15 um, 20 um, 30 um, 35 um, 40 um, 42 um or 50 um.

In one embodiment, the depth of the first enclosing groove 51 is greater than the depth of the second enclosing groove 52, that is, the thickness of the second solder layer 60 located in the first enclosing groove 51 is greater than the thickness of the solder layer 40 located in the first enclosing groove 51.

In one embodiment, the first solder layer 40 and the second solder layer 60 may include of one of lead, tin, and silver and an alloy containing any one of the foregoing solder metals. For example, the material of the first solder layer 40 and/or the second solder layer 60 may be an alloy with a tin content of 91.5% to 98.5% and a silver content of 8.5% to 1.5%. Optionally, the material of the first solder layer 40 and/or the second solder layer 60 may be an alloy with a tin content of 93.2% to 96.5% and a silver content of 6.8% to 3.5%, the first solder layer 40, and/or the material of the second solder layer 60 may be an alloy with a tin content of 98.2% to 98.5% and a silver content of 1.8% to 1.5%.

In one embodiment, the semiconductor base 20 includes a semiconductor substrate and a number of IC circuits and insulating layers. The material of the metal pad 10 may be aluminum or copper, but is not limited thereto.

In one embodiment, the cross section of the barrier layer 50 is H-shaped. The cross section of the barrier layer 50 can be understood as a longitudinal cross section of the barrier layer 50 with reference to FIG. 1 and FIG. 2. The barrier layer 50 is a barrel-shaped structure with a separator in the middle, and the second solder layer 60 and the first solder layer 40 are not in direct contact with each other.

In one embodiment, the barrier layer 50 and the bump 30 are spaced apart, and a first solder layer 40 is provided between the barrier layer 50 and the bump 30. The first solder layer 40 has a reversed T-shaped cross section, where the smaller end is located in the second enclosing groove 52, and the larger end is located beyond the second enclosing groove 52.

In one embodiment, the second solder layer 60 is provided in the first enclosing groove 51, and/or the first solder layer 40 is provided in the second enclosing groove 52. Wherein, the portion of the second solder layer 60 protruding out from the first enclosing groove 51 may cover a part of the upper surface of notch of the barrier layer 50 or fully cover the upper surface of the barrier layer 50, however, it is possible that the upper surface of the barrier layer 50 is not covered at all.

In an embodiment, the barrier layer 50 is a metal barrier layer, and the material of the barrier layer 50 may include nickel.

In one embodiment, the bump 30 is a copper pillar, and the semiconductor structure further includes: an under bump metal layer 70, at least part of the under bump metal layer 70 is sandwiched between the metal pad 10 and the bump 30. The metal material of the under-bump metal layer 70 may include a titanium (Ti) layer, a titanium tungsten (TiW) layer, and a copper (Cu) layer. The under-bump metal layer 70 is electrically connected to the metal pad 10. The under-bump metal layer 70 prevents the bump 30 from directly contacting the metal pad 10.

In one embodiment, the semiconductor structure further includes: a first protection layer 80 disposed on the semiconductor substrate 20, the first protection layer 80 has a first opening, and the first opening exposes a portion of the metal pad 10, that is, the first protection layer 80 covers the peripheral outer edge of the metal pad 10. Wherein, the material of the first protection layer 80 may be one or a combination of silicon dioxide and silicon nitride.

In one embodiment, the first protective layer 80 covers a part of the metal pad 10 and the semiconductor substrate 20 area outside the metal pad 10.

In one embodiment, the semiconductor structure further includes: a second protective layer 90 disposed on the first protective layer 80, the second protective layer 90 has a second opening, and the diameter of the second opening is smaller than or equal to the diameter of the first opening in the first protection layer 80; wherein, the under-bump metal layer 70 covers at least the bottom surface and the sidewalls of the second opening of the second protective layer, and at least part of the under-bump metal layer 70 is disposed in the second opening. The material of the second protective layer 90 may be polyimide.

In one embodiment, the under-bump metal layer 70 is disposed on a part of the second protection layer 90 and the exposed metal pad 10. In one embodiment, the under-bump metal layer 70 encloses the bump 30, that is, the bump 30 is located in the open cavity formed by the under-bump metal layer 70, and the plane of the notch of the under-bump metal layer 70 is in the same plane with the first bottom surface of the solder layer 40.

In one embodiment, as shown in FIG. 1, the semiconductor structure is composed of a semiconductor substrate 20, a metal pad 10, bumps 30, a first solder layer 40, a barrier layer 50, a second solder layer 60, and an under bump metal layer 70. A first protective layer 80 and a second protective layer 90, here the first protective layer 80 covers the metal pad 10, and shields part of the metal pad 10. The second protective layer 90 covers part of the first protective layer 80 as well as part of the metal pad 10. The second protection layer 90 and the part on the metal pad 10 under the first protection layer 80 face each other, that is, the first protection layer 80 is located under the second protection layer 90. The second protective layer 90 does not cover the middle part of the metal pad 10. The under-bump metal layer 70 is formed by physical vapor deposition to arrange a Ti layer, a TiW layer, and a Cu layer sequentially deposited on the bottom surface and sidewalls of the second opening of the second protective layer 90 over the metal pad 10. Here the Ti layer adheres and isolates thus prevents the metal copper from diffusing into the semiconductor substrate 20, and the Cu layer forms electroplated electrodes. The bump 30 has a T-shaped cross section, where the smaller end is located in the under-bump metal layer 70 and the larger end is located outside the under-bump metal layer 70.

In another embodiment, as shown in FIG. 2, the semiconductor structure is composed of a semiconductor substrate 20, a metal pad 10, a bump 30, a first solder layer 40, a barrier layer 50, a second solder layer 60, an under bump metal layer 70, and a first protective layer 80. The first protective layer 80 covers the metal pad 10 and shields the metal pad 10. In the under-bump metal layer 70, metal material layers such as Ti layer, TiW layer, and Cu layer are disposed sequentially on the metal pad 10 by the physical vapor deposition process. The Ti layer adheres and prevents the metal copper from entering the semiconductor substrate 20. The Cu layer forms electroplated electrodes. The bump 30 has a rectangular cross section, and is located between the under-bump metal layer 70 and the first solder layer 40.

An embodiment of the present invention also provides a method for manufacturing a semiconductor package structure, including: providing a semiconductor substrate 20, and forming a metal pad 10 on the semiconductor substrate 20; forming a bump 30 on the metal pad 10; forming a first solder layer 40 on the side of the bump 30 away from the metal pad 10; forming a barrier layer 50 on the side of the first solder layer 40 away from the bump 30; forming a second solder layer 60. on the side of the barrier layer 50 away from the first solder layer 40.

Specifically, the barrier layer 50 has a first enclosing groove 51 and a second enclosing groove 52 that are separated from each other. The notch of the first enclosing groove 51 faces away from the first solder layer 40, and the first solder layer 40 is disposed in the second enclosing 52, a second solder layer 60 is formed in the first enclosing groove 51, and a part of the second solder layer 60 protrudes from the notches of the first enclosing groove 51.

In one embodiment, a method for manufacturing a semiconductor structure includes: providing a semiconductor substrate 20 and forming a metal pad 10 on the semiconductor substrate 20; thrilling a bump 30 on the metal pad 10; and placing the bump 30 away from the metal pad 10. A first solder layer 40 is formed on one side of the metal pad 10; a barrier layer 50 is formed on the side of the first solder layer 40 away from the bump 30. The barrier layer 50 has a first enclosing groove 51 and a second enclosing groove 52 that are separated from each other. The notch of the enclosing groove 51 faces away from the first solder layer 40, and the first solder layer 40 is disposed in the second enclosing groove 52; a second solder layer 60 is formed in the first enclosing groove 51, and part of the second solder layer 60 protrudes from the notch of the first enclosing groove 51.

In one embodiment, before forming the bump 30, the manufacturing method further includes: forming an under-bump metal layer 70 on the metal pad 10; wherein at least part of the under-bump metal layer 70 is sandwiched between the metal pad 10 and the bump 30.

In one embodiment, before forming the bump 30, the manufacturing method further includes: forming a first protective layer 80 on the semiconductor substrate 20; wherein the first protective layer 80 has a first opening, and the first opening exposes a part of the metal pad 10.

In one embodiment, after forming the first protective layer 80, the manufacturing method further includes: forming a second protective layer 90 on the upper surface of the first protective layer 80 and the metal pad 10; after forming the second protective layer 90, an under-bump metal layer 70 is formed on the metal pad 10 and the second protection layer 90; wherein the second protection layer 90 has a second opening, and the diameter of the second opening the second protective layer 90 is smaller than or equal to the diameter of the first opening of the first protective layer 80. The under-bump metal layer 70 covers at least the bottom surface and the sidewalls of the second opening of the second protection layer 90, and at least part of the under-bump metal layer 70 is disposed in the second opening of the second protection layer 90.

In one embodiment, before forming the bump 30, the manufacturing method further includes: forming the first photoresist layer 11 on the semiconductor substrate 20 at a location outside the bump 30 and the first solder layer 40; after the bumps 30 and the first solder layer 40 are formed, the first photoresist layer 11 is removed.

In one embodiment, before forming the barrier layer 50, the manufacturing method further includes: forming the first mask layer 12 on the semiconductor substrate 20 on which the first solder layer 40 is formed; and using a photolithography process to pattern the first mask layer 12 to expose the part of the first solder layer 40; use a chemical acid etching process to etch the part of the first solder layer 40, and then remove the first mask layer 12; forming the second mask layer 13; here the mask layer 13 exposes the first solder layer 40, and forms a barrier layer 50 on the first solder layer 40 and the second mask layer 13, wherein a first solder layer 40 is provided between the barrier layer 50 and the bump 30.

In one embodiment, after forming the barrier layer 50, the manufacturing method further includes: forming a second photoresist layer 14 on the barrier layer 50 at a position corresponding to the first solder layer 40; Cover the barrier layer 50 at the position; remove the second photoresist layer 14; fill the first enclosing groove 51 with solder to form the second solder layer 60; remove the second mask layer 13.

In one embodiment, after the barrier layer 50 is formed, the manufacturing method further includes: forming a third photoresist layer on the barrier layer 50 outside of the first solder layer 40; filling the solder inside the first enclosing groove 51 to form the second solder layer 60; removing the third photoresist layer; etch the barrier layer 50 at the position not covered by the solder; and removing the second mask layer 13.

Figure 4:
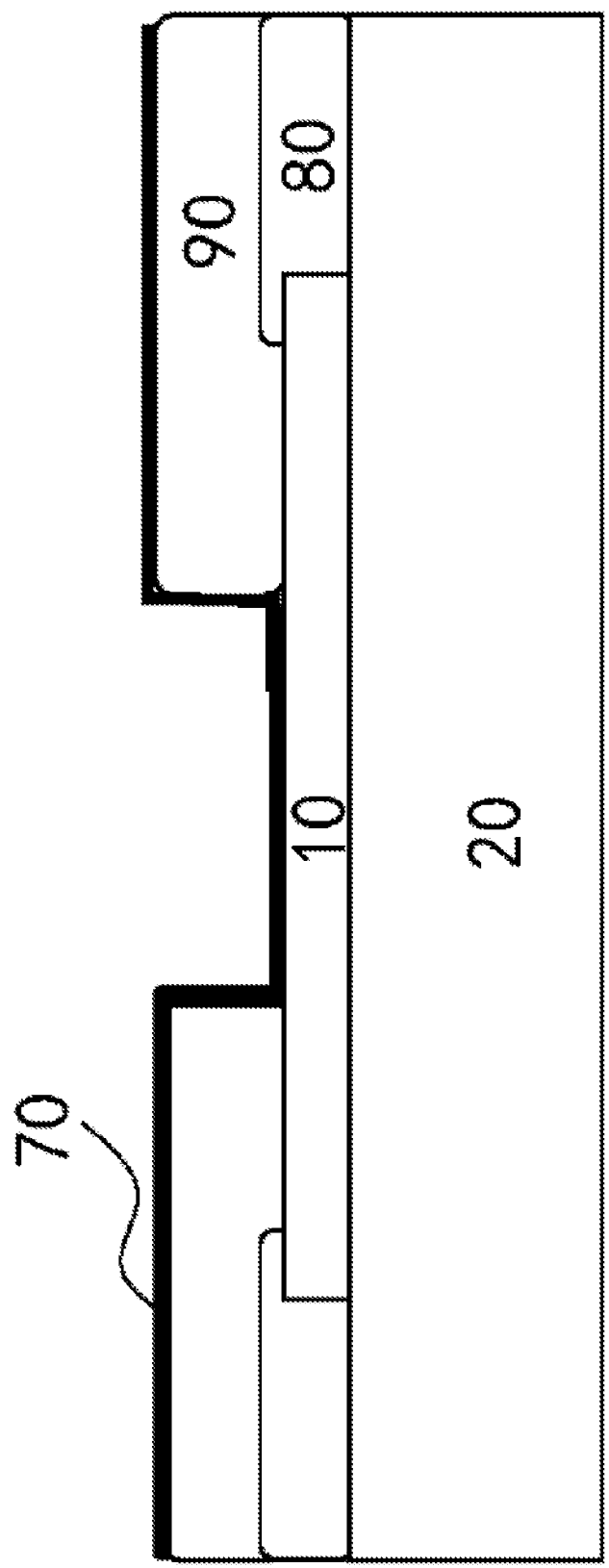
FIG. 4 is a schematic diagram showing a structure after forming an under-bump metal layer by a manufacturing method of a semiconductor structure according to an exemplary embodiment.

In an embodiment, specific steps of a method for manufacturing a semiconductor structure include:

As shown in FIG. 4, a first protective layer 80 is formed on the metal pact 10, and a second protective layer 90 is formed on the upper surface of the first protective layer 80 and the metal pad 10 using a deposition process. An opening is formed in the protective layer 90 where the bump 30 is planned, and a metal material is deposited on the metal pad 10 and the second protective layer 90 to form an under-bump metal layer 70, wherein the under-bump metal layer 70 covers all the first protective layers 80 and the opening of the second protective layer 90. The material of the first protective layer 80 may be one or a combination of silicon dioxide and silicon nitride, and the material of the second protective layer 90 may be polyimide. The metal material layer of the under-bump metal layer 70 may include a Ti layer, a TiW layer, and a Cu layer. The under-bump metal layer 70 is formed on the metal pad 10 and the second protective layer 90 by means of physical vapor deposition (PVD). The Ti layer of the under-bump metal layer 70 can adhere to and prevent the metal copper from diffusing into the semiconductor substrate 20 and the metal pad 10. The Cu layer of the under-bump metal layer 70 forms the electroplated copper pillar electrode (bump 30).

Figure 5:
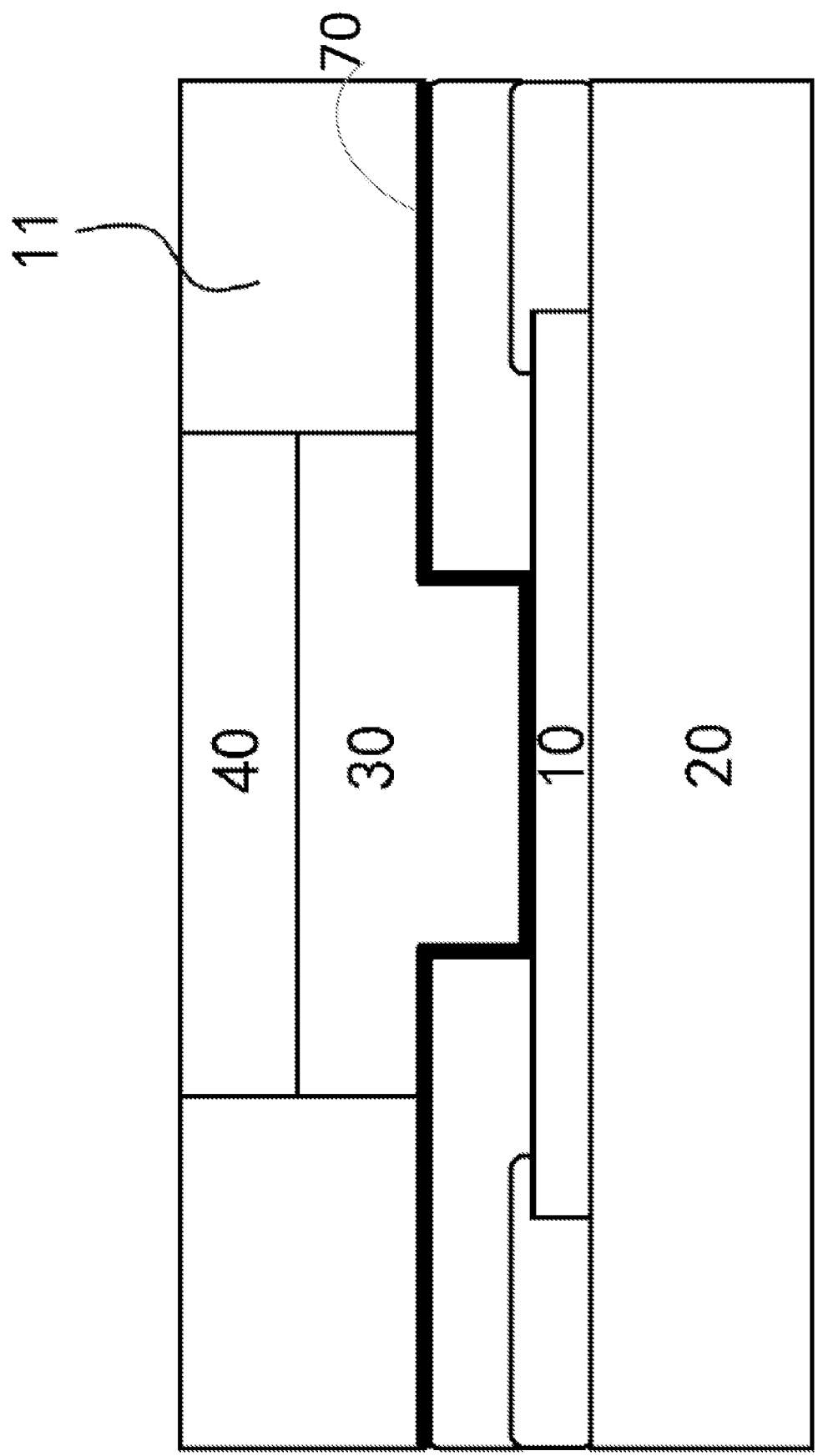
FIG. 5 is a schematic diagram showing a structure after forming a first solder layer by a method for manufacturing a semiconductor structure according to an exemplary embodiment.

As shown in FIG. 5, the first photoresist layer 11 is formed on the second protective layer 90 outside the bump 30 and the first solder layer 40, that is, leave a space in the middle of the first photoresist layer 11 preset for forming the bump 30 and the first solder layer 40, then the bump 30 and the first solder layer 40 are electroplated. The first patterning layer 11 may be a photoresist layer. After the photoresist layer is coated, it is exposed and developed to form a space for arranging the bump 30 and the first solder layer 40. The material of the first solder layer 40 may be one of lead, tin, and silver or an alloy containing any one of the foregoing solder metals. For example, the material of the first solder layer 40 may be an alloy with a tin content of 91.5% to 98.5% and a silver content of 8.5% to 1.5%. Optionally, the material of the first solder layer 40 may be an alloy with a tin content of 93.2% to 96.5% and a silver content of 6.8% to 3.5%, and the material of the first solder layer 40 may be an alloy with a tin content of 98.2% to 98.5%, Alloy with 1.8%~1.5% silver content, bump 30 is copper pillar.

Figure 6:
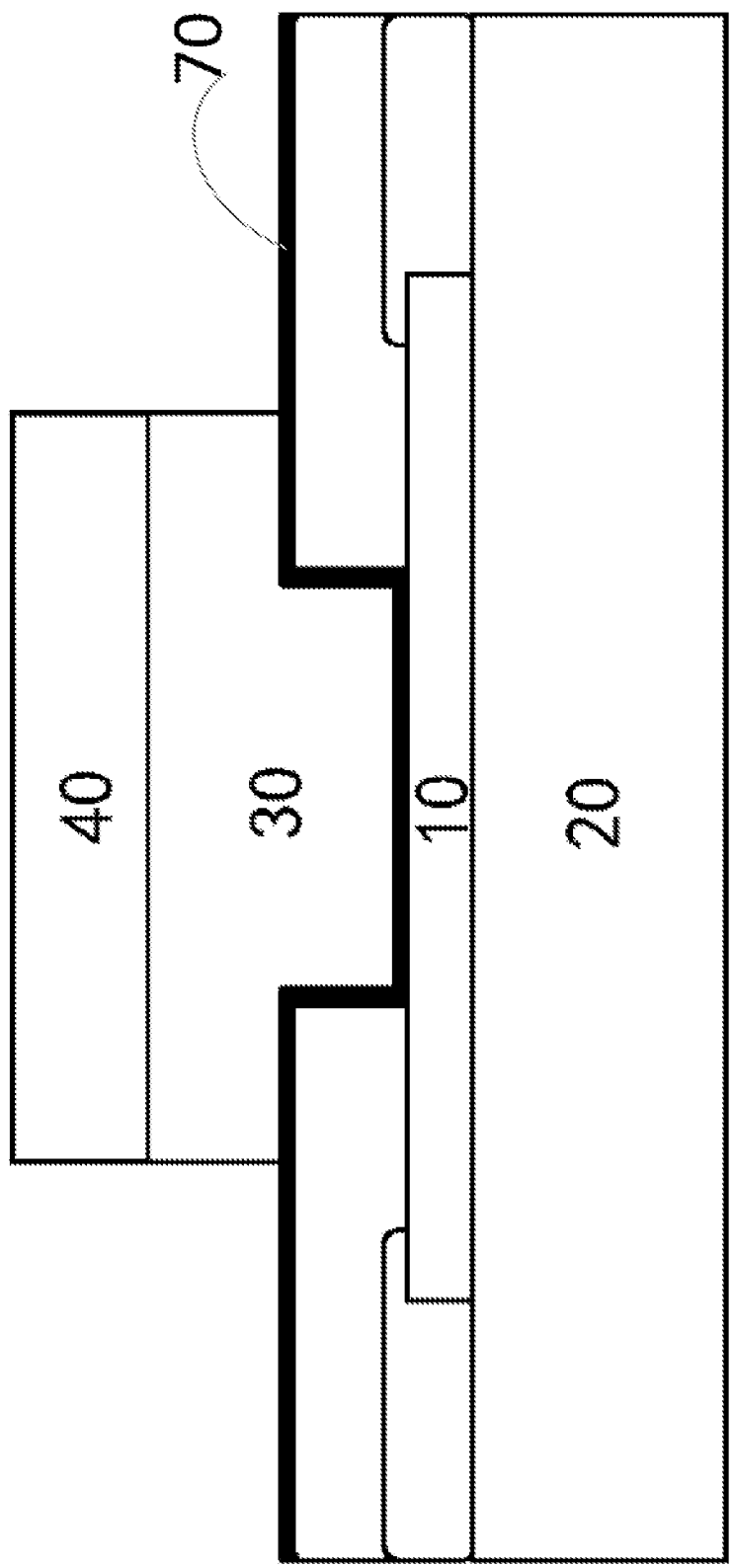
FIG. 6 is a schematic diagram showing a structure after removing the first photoresist layer by a manufacturing method of a semiconductor structure according to an exemplary embodiment.

As shown in FIG. 6, the first photoresist layer 11 is removed after the electroplated bump 30 and the first solder layer 40 are formed.

Figure 7:
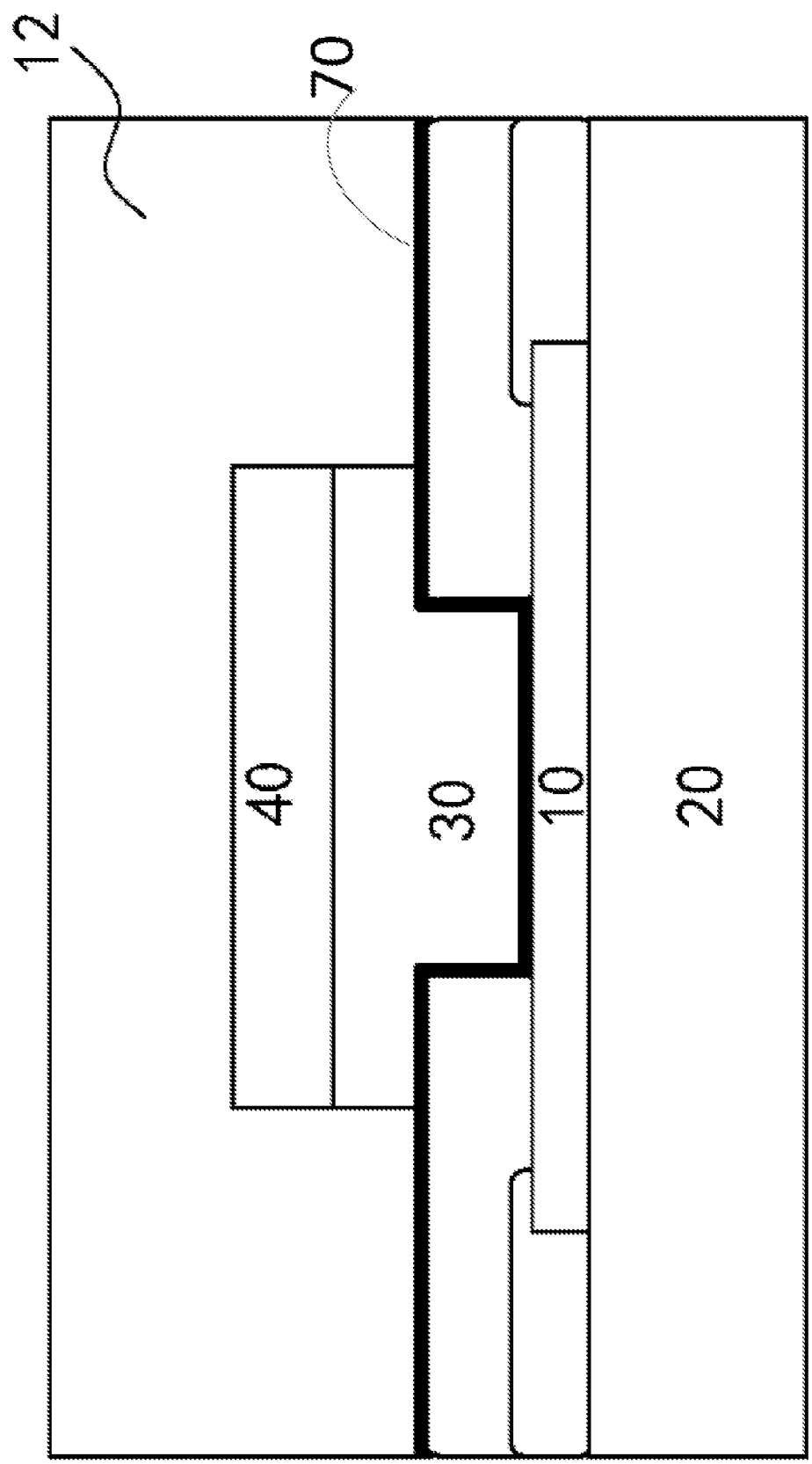
FIG. 7 is a schematic diagram showing a structure after forming a first mask layer by a method for manufacturing a semiconductor structure according to an exemplary embodiment.

As shown in FIG. 7, a first mask layer 12 is formed on the semiconductor substrate 20 on which the first solder layer 40 is formed. The first mask layer 12 covers the first solder layer 40 and the under-bump metal layer 70. Here the first mask layer 12 may be a polyimide layer.

Figure 8:
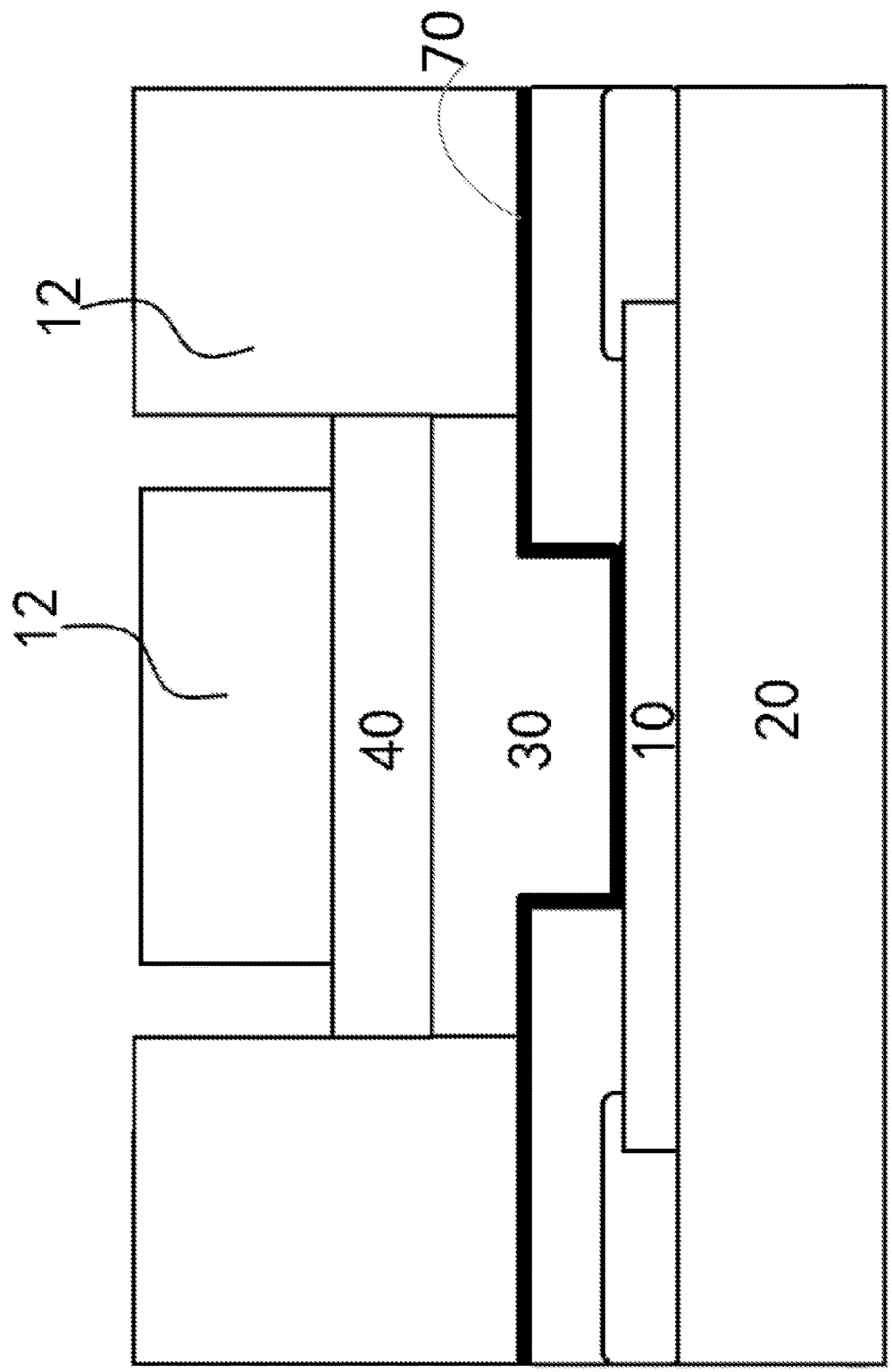
FIG. 8 is a schematic diagram of a structure after a first mask lithography layer according to a manufacturing method of a semiconductor structure according to an exemplary embodiment.

As shown in FIG. 8, the first mask layer 12 is lithographically exposed to expose part of the top surface of the first solder layer 40.

Figure 9:
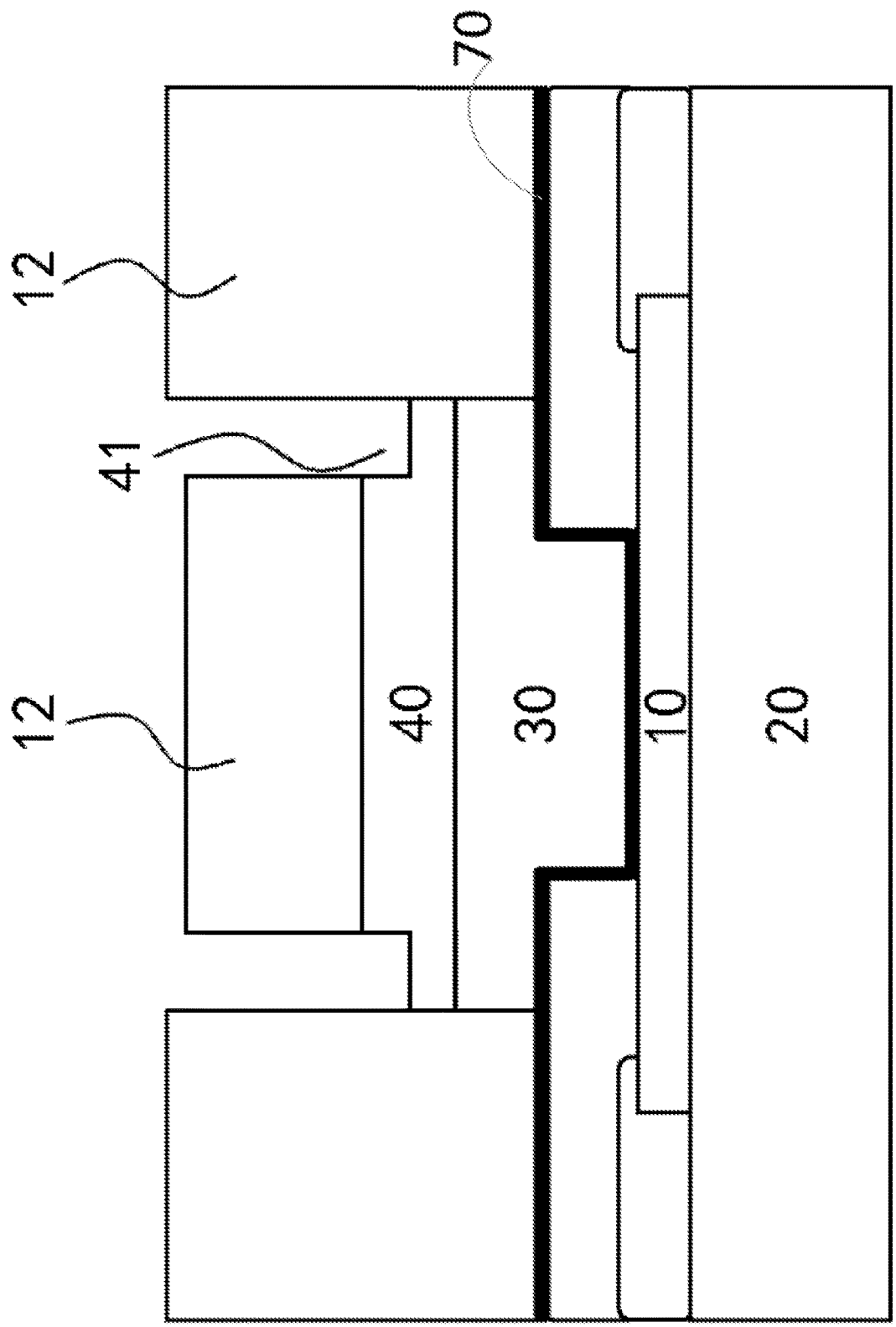
FIG. 9 is a schematic diagram of a structure after the first mask layer is etched by a method for preparing a semiconductor structure according to an exemplary embodiment.

As shown in FIG. 9, a part of the first solder layer 40 is etched by chemical acid to form a space 41.

Figure 10:
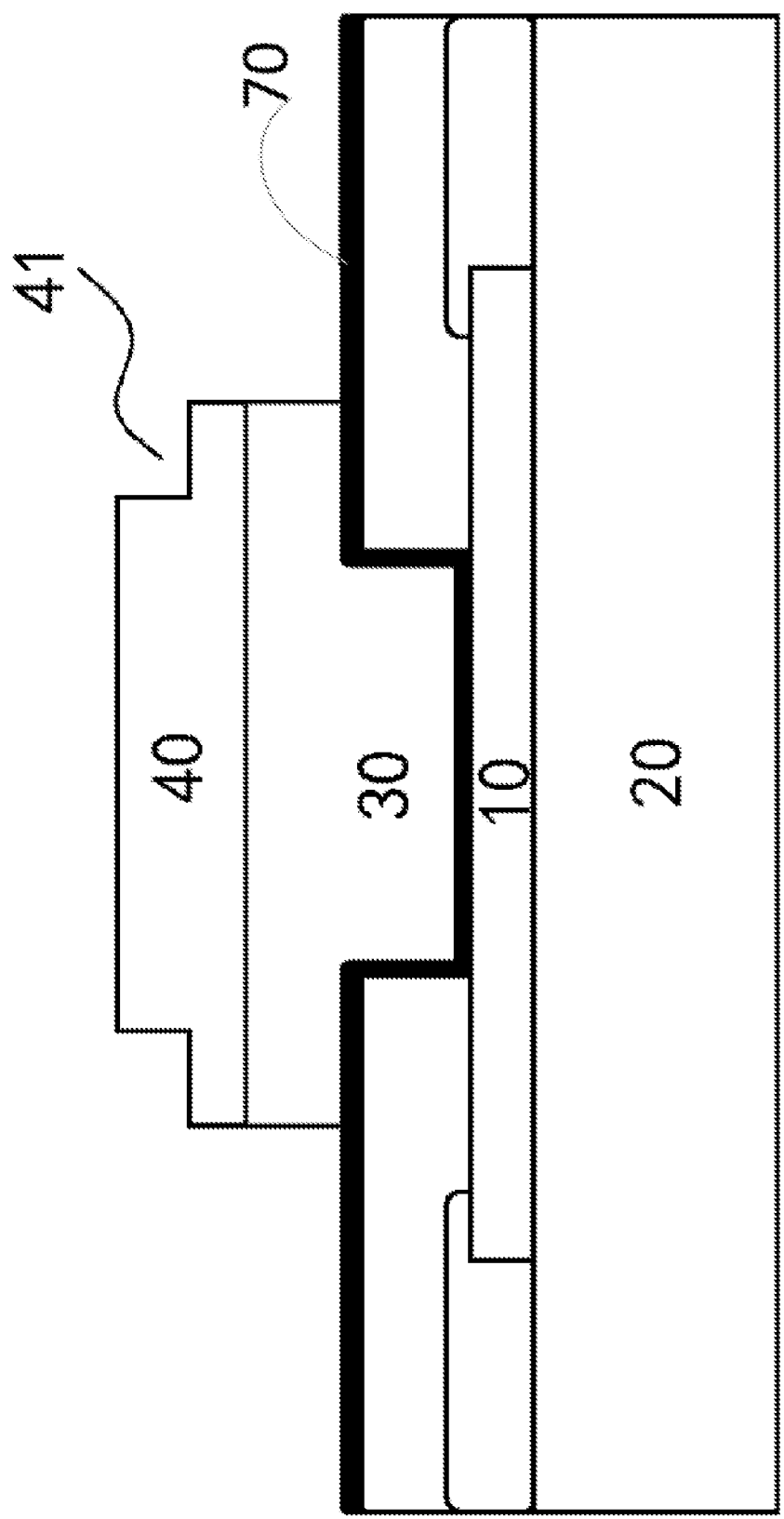
FIG. 10 is a schematic diagram showing a structure after removing the first mask layer by a manufacturing method of a semiconductor structure according to an exemplary embodiment.

As shown in FIG. 10, the first mask layer 12 is removed.

Figure 11:
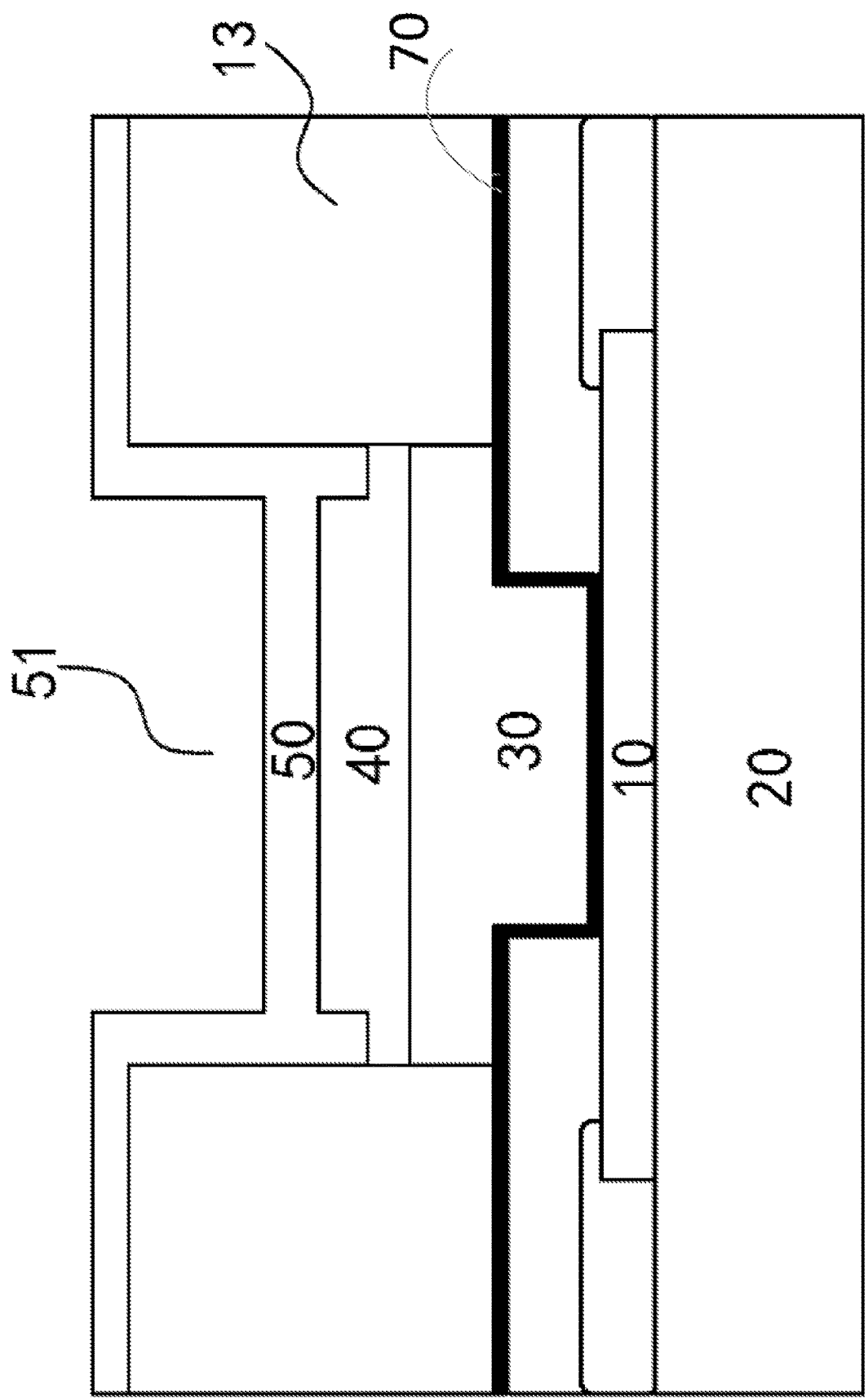
FIG. 11 is a schematic diagram showing a structure after forming a barrier layer by a manufacturing method of a semiconductor structure according to an exemplary embodiment.

As shown in FIG. 11, a second mask layer 13 is formed. The second mask layer 13 covers the first solder layer 40 and the under-bump metal layer 70. The second mask layer 13 is lithographically exposed to expose the first solder layer 40.

The barrier layer 50 is deposited on the second mask layer 13 and the first solder layer 40 by using a physical vapor deposition (PVD) technology. Wherein, the barrier layer 50 may be a nickel layer, and when the barrier layer 50 needs to be thickened, an electroplating process may be applied to increase the thickness of the nickel layer. Wherein, the second mask layer 13 may be a polyimide layer.

Figure 12:
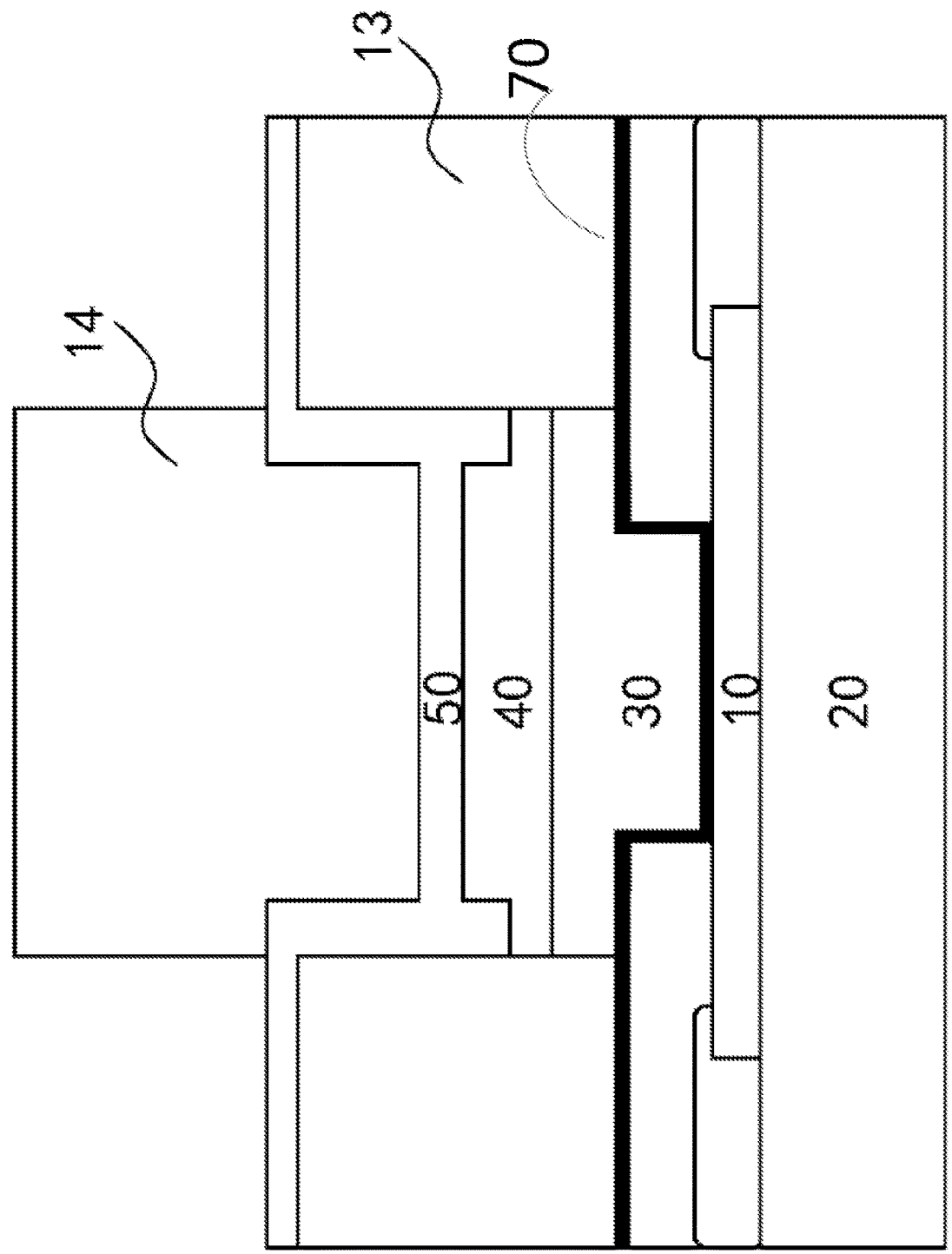
FIG. 12 is a schematic diagram showing a structure after forming a second photoresist layer by a method of manufacturing a semiconductor structure according to an exemplary embodiment.

As shown in FIG. 12, a second photoresist layer 14 is formed on the barrier layer 50 at a position above the first solder layer 40. Herein, the second photoresist layer 14 covers the upper part of the first solder layer 40 and serves as a mask for patterning of the barrier layer 50, and the second patterning layer 14 may be a photoresist layer.

Figure 13:
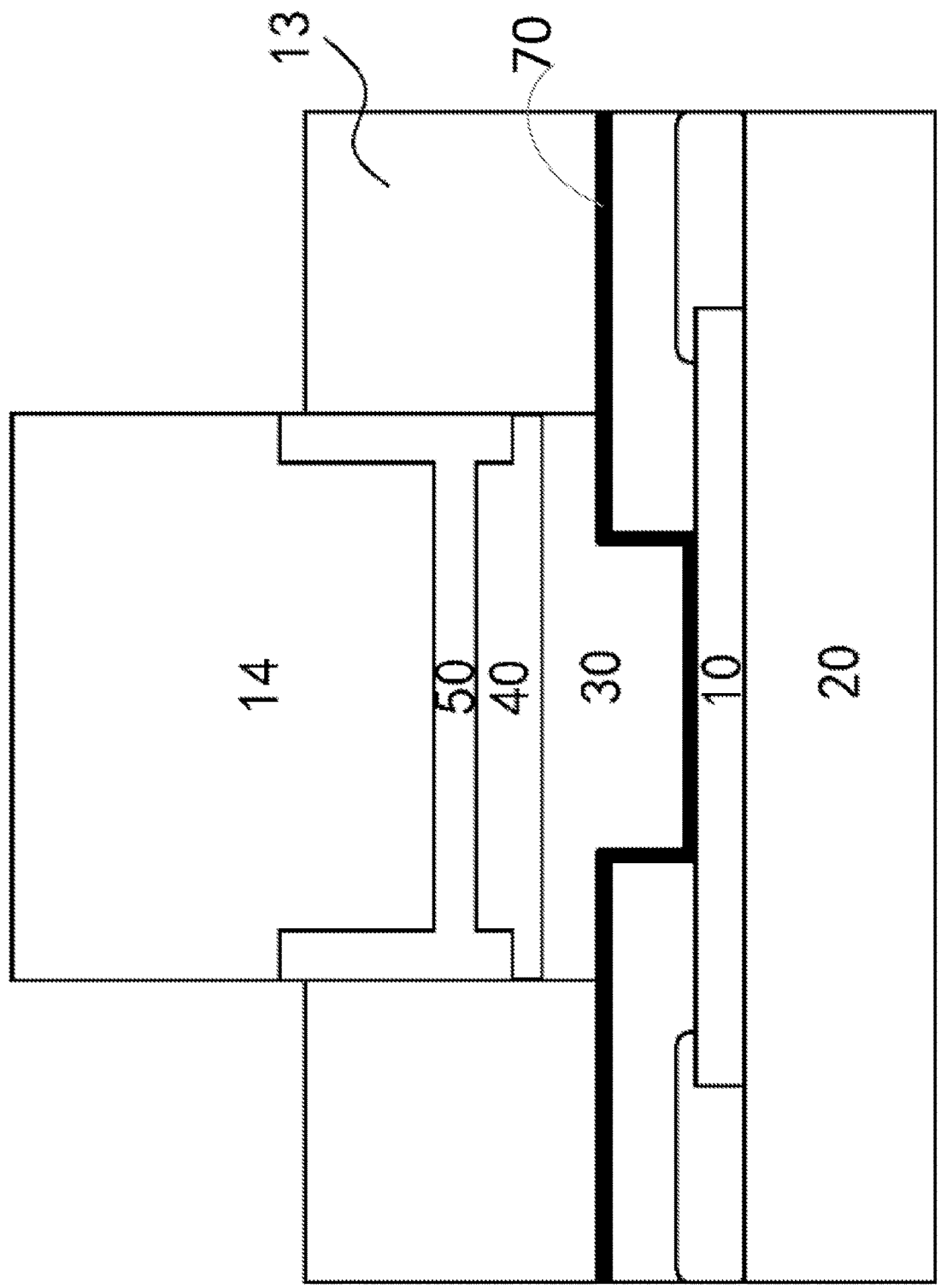
FIG. 13 is a schematic diagram of a structure after etching the barrier layer by a manufacturing method of a semiconductor structure according to an exemplary embodiment.

As shown in FIG. 13, the metal material of the barrier layer 50 is etched at a position not covered by the second photoresist layer 14.

Figure 14:
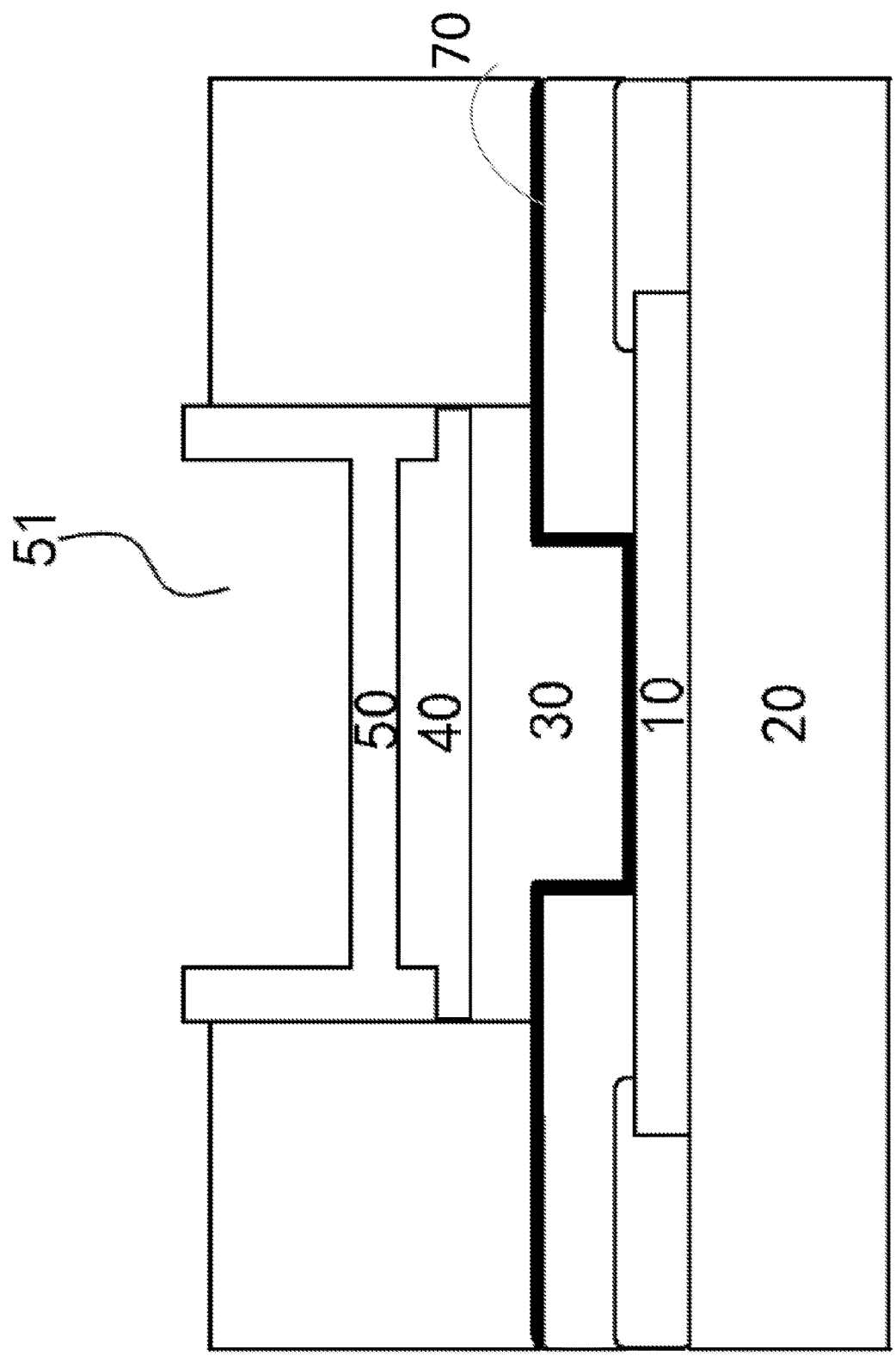
FIG. 14 is a schematic diagram showing a structure after removing a second photoresist layer by a manufacturing method of a semiconductor structure according to an exemplary embodiment.

As shown in FIG. 14, the second photoresist layer 14 is removed to expose the first enclosing groove 51 on the barrier layer 50.

Figure 15:
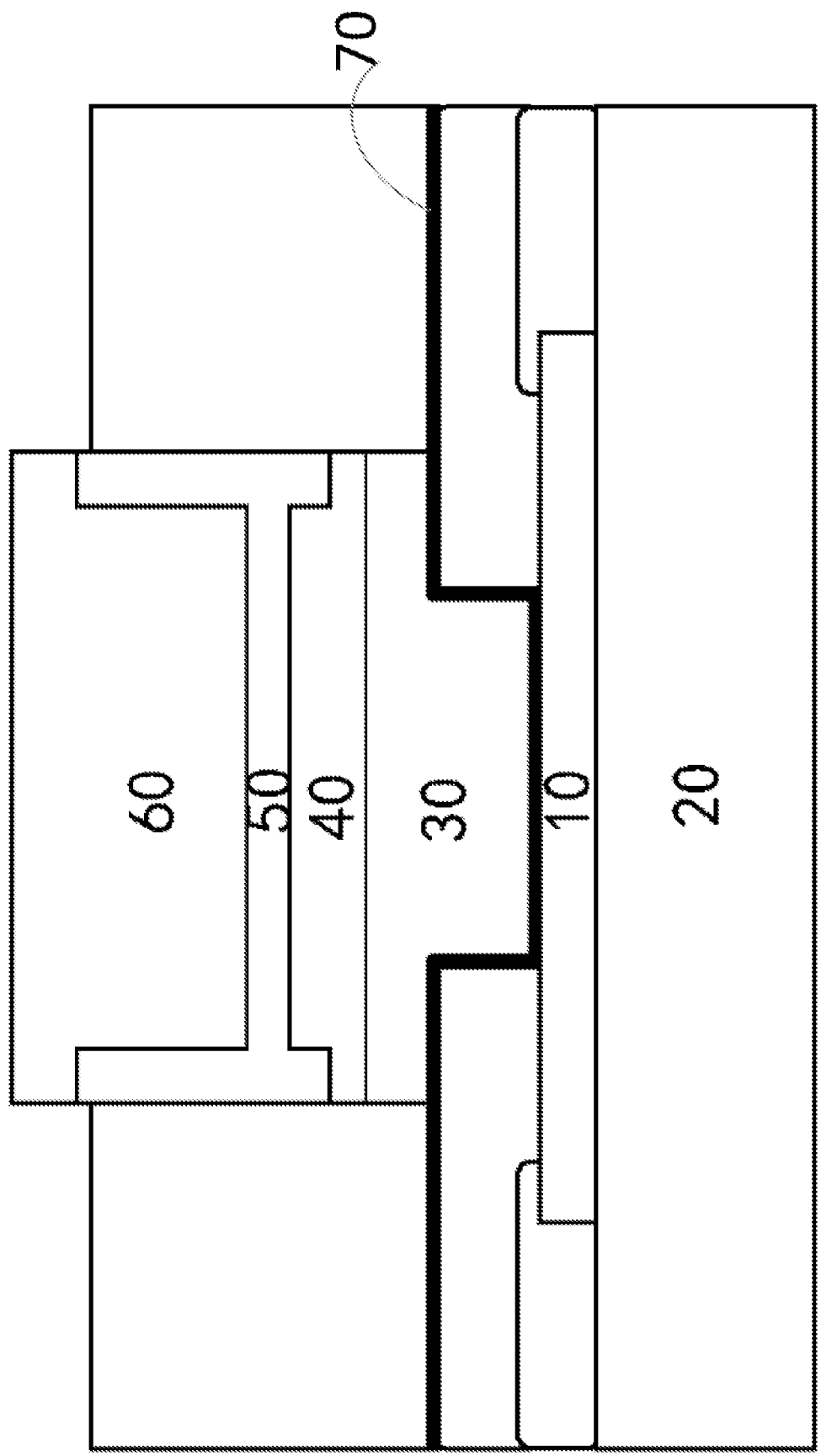
FIG. 15 is a schematic diagram showing a structure after forming a second solder layer by a manufacturing method of a semiconductor structure according to an exemplary embodiment.

As shown in FIG. 15, solder is filled in the first enclosing groove 51 to form a second solder layer 60, and the top surface of the second solder layer 60 is higher than the barrier layer 50. Wherein, the material of the second solder layer 60 may be one of lead, tin and silver or an alloy containing any one of the foregoing solder metals. For example, the material of the second solder layer 60 may be an alloy with a tin content of 91.5% to 98.5% and a silver content of 8.5% to 1.5%. Optionally, the material of the second solder layer 60 may be an alloy with a tin content of 93.2% to 96.5% and a silver content of 6.8% to 3.5%, and the material of the second solder layer 60 may be an alloy with a tin content of 98.2% to 98.5%, and an alloy containing 1.8% to 1.5% silver.

As shown in FIG. 16, the second mask layer 13 is etched. Then, the under-bump metal layer 70 is etched, and finally a high-temperature reflow process is applied to form a solder bump on the surface of the barrier layer 50, that is, the semiconductor structure shown in FIG. 1 is completed.

In another embodiment, specific steps of a method for manufacturing a semiconductor structure include the following.

After the fabrication process shown in FIGS. 4 to 11 is completed, the barrier layer 50 is deposited on the second mask layer 13 and the first solder layer 40 by applying the physical vapor deposition (PVD) technology.

A third photoresist layer is formed on the metal material of the barrier layer 5 outside the first solder layer 40. Herein, the third patterning layer may be a photoresist layer.

A second solder layer 60 is formed by filling solder in the first enclosing groove 51, and the top surface of the second solder layer 60 is higher than the barrier layer 50 but lower than the third photoresist layer. Wherein, the material of the solder layer may be one of lead, tin, and silver or an alloy containing any one of the foregoing solder metals. For example, the material of the second solder layer 60 may be an alloy with a tin content of 91.5% to 98.5% and a silver content of 8.5% to 1.5%. Optionally, the material of the second solder aver 60 may be an alloy with a tin content of 93.2% to 96.5% and a silver content of 6.8% to 3.5%, and the material of the second solder layer 60 may be an alloy with a tin content of 98.2% to 98.5%, and an alloy containing 1.8% to 1.5% silver.

Then the third photoresist layer is removed.

The second mask layer 13 is etched. Then, under-bump metal layer 70 is etched, and finally a high-temperature reflow process is applied to form a solder bump on the surface of the barrier layer 50, that is, the semiconductor structure shown in FIG. 1 is completed.

It should be noted that the barrier layer 50 may be a metal barrier layer.

Those skilled in the art will easily think of other embodiments of the present invention after considering the description and practicing the invention disclosed herein. The present invention is intended to cover any variations, uses or adaptive changes of the present invention. These variations, uses or adaptive changes follow the general principles of the present invention and include common knowledge or conventional technical means in the technical field not disclosed by the present invention. The specification and example embodiments are to be regarded as exemplary only, and the true scope and spirit of the present invention are pointed out by the following claims.

It should be understood that the present invention is not limited to the precise structure described above and shown in the drawings, and various modifications and changes can be made without departing from its scope. The scope of the present invention is only limited by the appended claims.

The present disclosure effectively overcomes various disadvantages in the related arts and hence has high industrial application value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

The invention claimed is:

1. A semiconductor structure, comprising:
a semiconductor substrate;
a metal pad disposed on the semiconductor substrate;
a bump disposed on the metal pad;
a barrier layer disposed on a side of the bump away from the metal pad, wherein the barrier layer includes a first surface and a second surface;
a first solder layer disposed between the bump and the first surface of the barrier layer; and
a second solder layer disposed on the second surface of the barrier layer;
wherein the barrier layer comprises a first groove, wherein a notch of the first groove faces a direction away from the first solder layer, and the second solder layer is disposed in the first groove, wherein a part of the second solder layer protrudes from the first groove; and
wherein the barrier layer further comprises a second groove, and wherein the first solder layer is disposed in the second groove.

2. The semiconductor structure of claim 1, wherein a cross section of the barrier layer has an H-shape.

3. The semiconductor structure of claim 1, wherein the barrier layer and the bump are separated by the first solder layer.

4. The semiconductor structure of claim 1, wherein the first groove and the second groove are both semi-closed grooves.

5. The semiconductor structure of claim 1, wherein a distance between a bottom surface of the second groove and a top surface of the bump is in a range of 5 um-50 um.

6. The semiconductor structure of claim 1, wherein a depth of the first groove is greater than a depth of the second groove.

7. A semiconductor structure, comprising:
a semiconductor substrate;
a metal pad disposed on the semiconductor substrate;
a bump disposed on the metal pad;
a barrier layer disposed on a side of the bump away from the metal pad, wherein the barrier layer includes a first surface and a second surface;
a first solder layer disposed between the bump and the first surface of the barrier layer; and
a second solder layer disposed on the second surface of the barrier layer;
wherein the bump comprises a copper pillar, wherein the semiconductor structure further comprises: an under-bump metal layer, wherein at least a part of the under-bump metal layer is sandwiched between the metal pad and the bump.

8. The semiconductor structure of claim 7, wherein the semiconductor structure further comprises: a first protection layer disposed on the semiconductor substrate, wherein the first protection layer comprises a first opening, and wherein the first opening exposes a part of the metal pad.

9. The semiconductor structure of claim 8, wherein the semiconductor structure further comprises:
a second protective layer disposed on the first protective layer, wherein the second protective layer comprises a second opening, wherein a width of the second opening is smaller than or equal to a width of the first opening; and
wherein at least part of the under-bump metal layer is disposed in the second opening and covers a bottom surface and sidewall surfaces of the second opening.

10. A method of manufacturing a semiconductor structure, comprising:
providing a semiconductor substrate;
forming a metal pad on the semiconductor substrate;
forming a bump on the metal pads;
forming a first solder layer on a side of the bump away from the metal pad;
forming a barrier layer on a side of the first solder layer away from the bump; and
forming a second solder layer on a side of the barrier layer away from the first solder layer;
wherein the barrier layer comprises a first groove and a second groove separated from each other, wherein a notch of the first groove faces away from the first solder layer, wherein the first solder layer is arranged in the second groove, the second solder layer is formed in the first groove, and wherein a part of the second solder layer protrudes from the notch of the first groove.

11. The manufacturing method of claim 10, wherein before forming the bump, the manufacturing method further comprises: forming an under-bump metal layer on the metal pad, wherein at least part of the under-bump metal layer is sandwiched between the metal pad and the bump.

12. The manufacturing method of claim 11, wherein before forming the bump, the manufacturing method further comprises:
forming a first protective layer on the semiconductor substrate, wherein the first protection layer has a first opening, and wherein the first opening exposes a part of the metal pad.

13. The manufacturing method of claim 12, wherein after forming the first protective layer, the manufacturing method further comprises:
forming a second protective layer on an upper surface of the first protective layer and an upper surface of the metal pad;
wherein after forming the second protection layer, forming the under-bump metal layer on the metal pad and the second protection layer;
wherein the second protection layer comprises a second opening, wherein a width of the second opening is smaller than or equal to a width of the first opening; and
wherein at least part of the under-bump metal layer is disposed in the second opening and covers a bottom surface and sidewall surfaces of the second opening.

14. The manufacturing method of claim 10, before forming the bump, further comprising:
forming a first photoresist layer on the semiconductor outside an area of the bump and the first solder layer; and
removing the first photoresist layer after forming the bump and the first solder layer.

15. The manufacturing method of claim 10, before forming the barrier layer, further comprising:
forming a first mask layer on the semiconductor substrate covering the first solder layer;
patterning the first mask layer by a photolithography process to expose a part of the first solder layer;
etching the part of the first solder layer by a chemical acid etching process, and removing the first mask layer;
forming a second mask layer; and
patterning the second mask layer by a photolithography process to expose the first mask layer, wherein the barrier layer is formed on the first solder layer and the second mask layer, wherein the first solder layer is configured between the barrier layer and the bump.

16. The manufacturing method of claim 15, after forming the barrier layer, further comprising:
forming a second photoresist layer on the barrier layer aligned above to the first solder layer;
patterning the barrier layer not covered by the second photoresist layer;
removing the second photoresist layer;
filling solder in the first groove to form the second solder layer; and
removing the second mask layer.

17. The manufacturing method of claim 15, after forming the barrier layer, further comprising:
forming a third photoresist layer on the barrier layer in areas not aligned above to the first solder layer;
filling solder in the first groove to form the second solder layer;
removing the third photoresist layer;
etching the barrier layer at a location not covered by solder; and
removing the second mask layer.

* * * * *